United States Patent
Majkowski et al.

(10) Patent No.: US 10,404,294 B1
(45) Date of Patent: Sep. 3, 2019

(54) WIRELESS COMMUNICATION DEVICE WITH EFFICIENT BROADBAND MATCHING NETWORK AND RELATED METHODS

(71) Applicant: HARRIS GLOBAL COMMUNICATIONS, INC., Rochester, NY (US)

(72) Inventors: Joseph D. Majkowski, Pittsford, NY (US); Malcolm J. Packer, Fairport, NY (US)

(73) Assignee: HARRIS GLOBAL COMMUNICATIONS, INC., Albany, NY (US)

( * ) Notice: Subject to any disclaimer, the term of this patent is extended or adjusted under 35 U.S.C. 154(b) by 0 days.

(21) Appl. No.: 16/135,238

(22) Filed: Sep. 19, 2018

(51) Int. Cl.
| | |
|---|---|
| *H04B 1/04* | (2006.01) |
| *H03H 7/38* | (2006.01) |
| *H01C 1/084* | (2006.01) |
| *H01Q 9/30* | (2006.01) |
| *H01Q 5/335* | (2015.01) |
| *H01Q 1/02* | (2006.01) |
| *H01F 19/04* | (2006.01) |

(52) U.S. Cl.
CPC ............... *H04B 1/04* (2013.01); *H01C 1/084* (2013.01); *H01F 19/04* (2013.01); *H01Q 1/02* (2013.01); *H01Q 5/335* (2015.01); *H01Q 9/30* (2013.01); *H03H 7/38* (2013.01)

(58) Field of Classification Search
CPC . H04B 1/04; H01Q 5/335; H01Q 1/02; H01Q 9/30; H01C 1/084; H01F 19/04; H03H 7/38
See application file for complete search history.

(56) References Cited

U.S. PATENT DOCUMENTS

| | | |
|---|---|---|
| 2,470,307 A | 5/1949 | Gustav |
| 3,614,676 A | 10/1971 | Boelke |
| 3,794,941 A | 2/1974 | Templin |
| 3,950,757 A | 4/1976 | Blass |
| 3,969,681 A | 7/1976 | Fincke |
| 4,028,704 A | 6/1977 | Blass |
| 4,048,598 A | 9/1977 | Knight |
| 4,200,850 A | 4/1980 | Valdettaro |
| 4,328,501 A | 5/1982 | DeSantis et al. |
| 4,443,803 A | 4/1984 | DeSantis et al. |
| 4,571,596 A | 2/1986 | Hodgkinson |

(Continued)

*Primary Examiner* — Nguyen T Vo
(74) *Attorney, Agent, or Firm* — Allen, Dyer, Doppelt + Gilchrist, P.A.

(57) ABSTRACT

A wireless communications device may include an RF transmitter having an operating frequency range, an RF antenna having an electrical length less than or equal to one-tenth of a wavelength of a lowest operating frequency of the operating frequency range, and an RF matching network coupled between the RF transmitter and the RF antenna. The RF matching network may include a first RF matching transformer, a first inductor coupled between a first reference terminal and a reference voltage, a first resistor coupled across a first output terminal and the first reference terminal and configured to dissipate heat that would otherwise be dissipated by the first RF matching transformer to reduce an operating temperature of the first RF matching transformer, and a heat sink coupled to the first resistor.

20 Claims, 8 Drawing Sheets

(56) References Cited

U.S. PATENT DOCUMENTS

| | | |
|---|---|---|
| 5,825,332 A | 10/1998 | Camacho et al. |
| 6,121,940 A | 9/2000 | Skahill et al. |
| 6,337,608 B1 | 1/2002 | McLean et al. |
| 6,703,080 B2 | 3/2004 | Reyzelman et al. |
| 6,822,621 B2 | 11/2004 | Lamour et al. |
| 6,961,368 B2 | 11/2005 | Dent et al. |
| 7,142,833 B2 | 11/2006 | Hibino et al. |
| 7,319,435 B2 | 1/2008 | Rauch |
| 7,898,493 B1 | 3/2011 | Rojas et al. |
| 8,462,064 B2 | 6/2013 | Packer et al. |
| 8,743,009 B2 | 6/2014 | Packer |
| 8,836,602 B2 | 9/2014 | Hutcheson |
| 2008/0252535 A1 | 10/2008 | Parsche |
| 2008/0305750 A1 | 12/2008 | Alon et al. |
| 2013/0069835 A1 | 3/2013 | Swais et al. |
| 2014/0028398 A1 | 1/2014 | Owen |
| 2016/0276728 A1* | 9/2016 | Lilly .................. H01Q 1/50 |

\* cited by examiner

US 10,404,294 B1

WIRELESS COMMUNICATION DEVICE WITH EFFICIENT BROADBAND MATCHING NETWORK AND RELATED METHODS

TECHNICAL FIELD

The present disclosure relates to the field of communications, and, more particularly, to a wireless communications device and related methods.

BACKGROUND

Mobile communications devices have become an integral part of society over the last two decades. Mobile communications devices are deployed to government personnel, and emergency service providers. In some applications, the mobile communications device is handheld, but in other applications, the mobile communications device may be more bulky, yet still portable, such as a manpack radio, as available from the Harris Corporation of Melbourne, Fla. The typical mobile communications device includes an antenna, and a transceiver coupled to the antenna. The transceiver and the antenna cooperate to transmit and receive communications signals.

Before transmission, the typical mobile communications device modulates digital data onto an analog signal. As will be readily appreciated by the skilled person, there is a plurality of modulations available for most applications.

For most communications devices, the transmitted and received signals are spectrally limited. In other words, the communications device operates within an expected frequency range, such as the ultra high frequency (UHF) range or the very high frequency (VHF) range. Because of the known operational characteristic, the communications device is usually designed to operate optimally within the expected frequency range. Nevertheless, as communications devices have become more robust in the included feature set, some applications demand operating within multiple frequency bands, i.e. multi-band devices.

In some multi-band devices, the transmit and receive architecture may comprise a plurality of paths with respective amplifiers/receivers and antennas. In other applications, there may be a common transmit and receive path with a single antenna. In these latter applications, it can be challenging to optimize the common transmit and receive path to perform optimally in each of the operational frequency bands.

In particular, it may be problematic to design optimum impedance matching for the common antenna across each operational frequency band. One approach to these design hurdles is to sacrifice optimal performance in all bands for an architecture with passable performance in the operational frequency bands. These design hurdles can be more troublesome in communications devices that are "electrically short", i.e. where the antenna length is short relative to a resonant length at the operational frequency ranges.

U.S. Pat. No. 8,743,009 to Packer, which is assigned to the Harris Corporation, discloses an approach to an antenna system. Here, a device reduces a length of an antenna and involves an arrangement which includes an orthogonal antenna feed. The antenna includes a radiating element with a length extending along an axis. The orthogonal feed arrangement permits recovery of a portion of the spatial volume comprising the antenna, which is normally used for antenna matching circuitry. An end portion of the radiating element is chosen to be helically shaped and includes a radio frequency (RF) feed gap. The RF feed gap is coupled to a matching network, which includes elongated conductors. The matching circuitry is positioned so that the elongated conductors are adjacent to the first end portion and extend in a direction aligned with the axis, but orthogonal to the coils forming the helically shaped end portion.

SUMMARY

Generally, a transportable wireless communications device may include an RF transmitter having an operating frequency range, an RF antenna having an electrical length less than or equal to one-tenth of a wavelength of a lowest operating frequency of the operating frequency range, and an RF matching network coupled between the RF transmitter and the RF antenna. The RF matching network may include a first RF matching transformer comprising a first ferrite core and a first plurality of windings coupled thereto. The first RF matching transformer may define a first input terminal, a first output terminal, and a first reference terminal. The RF matching network may comprise a first inductor coupled between the first reference terminal and a reference voltage, and at least one first resistor coupled across the first output terminal and the first reference terminal and configured to dissipate heat that would otherwise be dissipated by the first RF matching transformer to reduce an operating temperature of the first RF matching transformer. A heat sink may be coupled to the at least one first resistor.

In some embodiments, the at least one first resistor may include a plurality of first resistors coupled in parallel. The at least one first resistor may comprise at least one first thick film resistor. Also, the heat sink may comprise a metal body. The metal body may comprise at least a portion of an RF connector coupled to the RF antenna. The heat sink may be thermally coupled to the RF antenna. The first ferrite core may comprise a ferrite body having a pair of spaced apart, winding-receiving passageways therein.

Moreover, the RF matching network may comprise a second RF matching transformer coupled between the RE transmitter and the first RF matching transformer and comprising a second ferrite core and a second plurality of windings coupled thereto. The second RF matching transformer may define a second input terminal coupled to the RF transmitter, a second output terminal coupled to the first input terminal of the first RF matching transformer, and a second reference terminal coupled to the reference voltage. The RF matching network may include a second inductor coupled between the second input terminal and the second reference terminal of the second RF matching transformer, and at least one second resistor coupled between the second input terminal and the second reference terminal of the second RF matching transformer.

Another aspect is directed to an RF matching network coupled between a RF transmitter and a RF antenna. The RF antenna may have an electrical length less than or equal to one-tenth of a wavelength of a lowest operating frequency of an operating frequency range of the RF transmitter. The RF matching network may include a first RF matching transformer comprising a first ferrite core and a first plurality of windings coupled thereto. The first RF matching transformer may define a first input terminal, a first output terminal, and a first reference terminal. The RF matching network may include a first inductor coupled between the first reference terminal and a reference voltage, and at least one first resistor coupled across the first output terminal and the first reference terminal and configured to dissipate heat that would otherwise be dissipated by the first RF matching transformer to reduce an operating temperature of the first RF matching transformer. The RF matching network may include a heat sink coupled to the at least one first resistor and comprising at least a portion of an RF connector coupled to the RF antenna.

Yet another aspect is directed to a method of making a wireless communications device. The method may include providing an RF transmitter having an operating frequency range, and an RF antenna having an electrical length less than or equal to one-tenth of a wavelength of a lowest operating frequency of the operating frequency range, and coupling an RE matching network between the RF transmitter and the RF antenna. The RF matching network may include a first RF matching transformer comprising a first ferrite core and a first plurality of windings coupled thereto. The first RF matching transformer may define a first input terminal, a first output terminal, and a first reference terminal. The RF matching network may include a first inductor coupled between the first reference terminal and a reference voltage, and at least one first resistor coupled across the first output terminal and the first reference terminal and configured to dissipate heat that would otherwise be dissipated by the first RF matching transformer to reduce an operating temperature of the first RF matching transformer. A heat sink may be coupled to the at least one first resistor.

DETAILED DESCRIPTION

Figure 1:
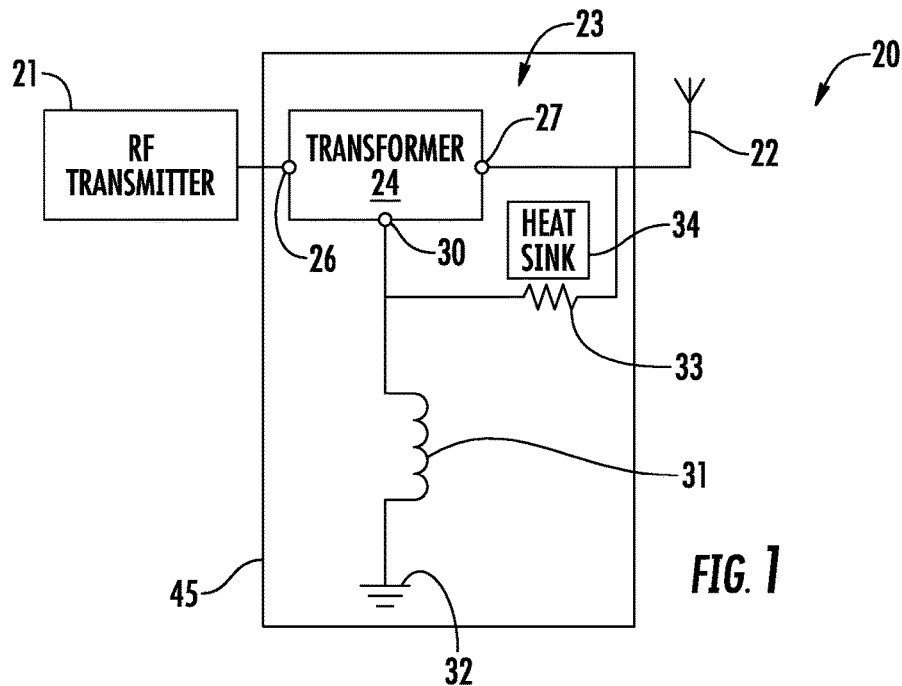
FIG. 1 is a schematic diagram of an example embodiment of a wireless communications device, according to the present disclosure.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and base 100 reference numerals are used to indicate similar elements in alternative embodiments.

Figure 4A:
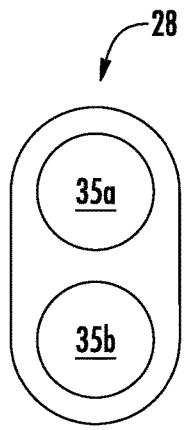
FIGS. 4A and 4B are a schematic side view and a perspective image, respectively, of an RF matching transformer from the wireless communications device of FIG. 1.
Figure 4B:
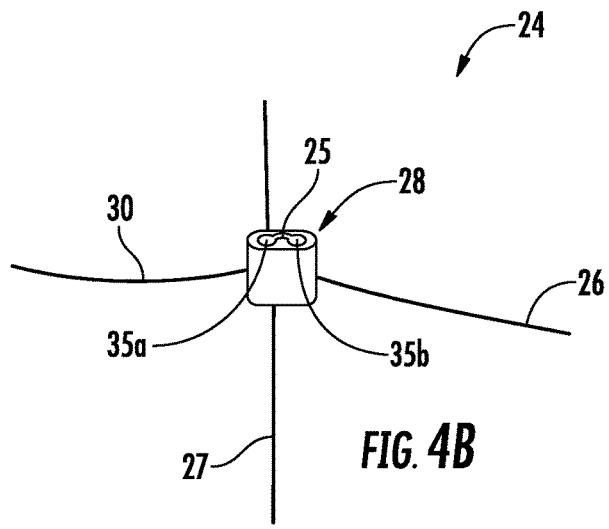

Referring initially to FIGS. 1 and 4A-4B, a wireless communications device 20 according to the present embodiments is now described. The wireless communications device 20 illustratively includes an RF transmitter 21 having an operating frequency range (e.g. VHF, UHF), and an RF antenna 22 having an electrical length less than or equal to one-tenth of a wavelength of a lowest operating frequency of the operating frequency range (i.e. an electrically short antenna device).

The wireless communications device 20 illustratively includes an RF matching network 23 coupled between the RF transmitter 21 and the RF antenna 22. The RF matching network 23 illustratively includes a first RF matching transformer 24 comprising a first ferrite core 28 and a first plurality of windings 25 coupled thereto. In other embodiments, the ferrite material may be exchanged for other ferromagnetic materials. The first RF matching transformer 24 comprises an impedance transformer. The first ferrite core 28 illustratively includes a ferrite body having a pair of spaced apart, winding-receiving passageways 35a-35b therein.

The first RF matching transformer 24 defines a first input terminal 26, a first output terminal 27, and a first reference terminal 30. The RF matching network 23 illustratively includes a first inductor 31 coupled between the first reference terminal 30 and a reference voltage 32 (e.g. the illustrated ground potential), and a first resistor 33 coupled across the first output terminal 27 and the first reference terminal 30. Advantageously, and as demonstrated with the simulations disclosed herein, the resistance and inductance values of the first resistor 33 and the first inductor 31 can be selectively determined to provide desired transmission path characteristics.

In some embodiments, the first resistor 33 may comprise at least one first thick film resistor. As will be appreciated by those skilled in the art, thick film resistors are used but thin film or even carbon resistors may be used and have a low cost compared to any other technology. The resistive material is a special paste with a mixture of a binder, a carrier, and the metal oxides to be deposited. The binder is a glassy frit, and the carrier exists of organic solvent systems and plasticizers. Typical resistor pastes are based on oxides of ruthenium, iridium and rhenium. This is also referred to as a cermet (i.e. Ceramic-Metallic). The resistive layer is printed onto a substrate at 850° C. The substrate is often 95% alumina ceramic. After the firing of the paste on the carrier, the film becomes glasslike, which makes it well protected against moisture. The resistive layers are added sequentially to the substrate to create the conducting patterns and resistance values. The temperature coefficient typically ranges from 50 ppm to 200 ppm/K. Tolerances are between 1% and 5%.

In some embodiments, the first resistor 33 may comprise at least one first resistor. The first resistor 33 is configured to dissipate heat (i.e. thermal infrared radiation) that would otherwise be dissipated by the first RF matching transformer 24 (in particular, the ferrite core) to reduce an operating temperature of the first RF matching transformer, as compared to typical devices where device temperatures exceed 250° C. for 10 watts of transmit power. In particular, the first resistor 33 dissipates most of the thermal energy, which reduces the operating temperature of the first RF matching transformer 24. The RF matching network 23 illustratively includes a heat sink 34 coupled to the first resistor 33.

Indeed, as shown in Table 1 herein, the operating temperatures for the wireless communications device 20 are reduced. Positively, these temperatures are well below the Curie temperature (450° C.) of the ferrite core of the first RF matching transformer 24.

TABLE 1

| RF Power | 3 min | 5 min | 10 min |
| --- | --- | --- | --- |
| 10 W | 95° C. | 110° C. | 121° C. |
| 12 W | 115° C. | 130° C. | 145° C. |
| 16 W | 140° C. | 160° C. | 182° C. |

Also, the wireless communications device 20 further comprises an antenna assembly. The antenna assembly illustratively includes a housing 45 carrying the RF antenna 22, and the RF matching network 23. For example, in some embodiments, the portable housing 45 may be handheld housing. In other embodiments, the portable housing 45 may have manpack radio housing, as available from the Harris Corporation of Melbourne, Fla. Because of the portable, on-person, nature of these form factors, the reduction in operation temperatures is helpful for the user.

Another aspect is directed to a method of making a wireless communications device 20. The method includes providing an RF transmitter 21 having an operating frequency, and an RF antenna 22 having an electrical length less than or equal to one-tenth of a wavelength of the operating frequency, and coupling an RF matching network 23 between the RF transmitter and the RF antenna. The RF matching network 23 includes a first RF matching transformer 24 comprising a first ferrite core 28 and a first plurality of windings 25 coupled thereto. The first RF matching transformer 24 defines a first input terminal 26, a first output terminal 27, and a first reference terminal 30. The RF matching network 23 includes a first inductor 31 coupled between the first reference terminal 30 and a reference voltage 32, at least one first resistor 33 coupled across the first output terminal 27 and the first reference terminal 30 and configured to dissipate heat that would otherwise be dissipated by the first RF matching transformer 24 to reduce an operating temperature of the first RF matching transformer, and a heat sink 34 coupled to the at least one first resistor 33.

Figure 2:
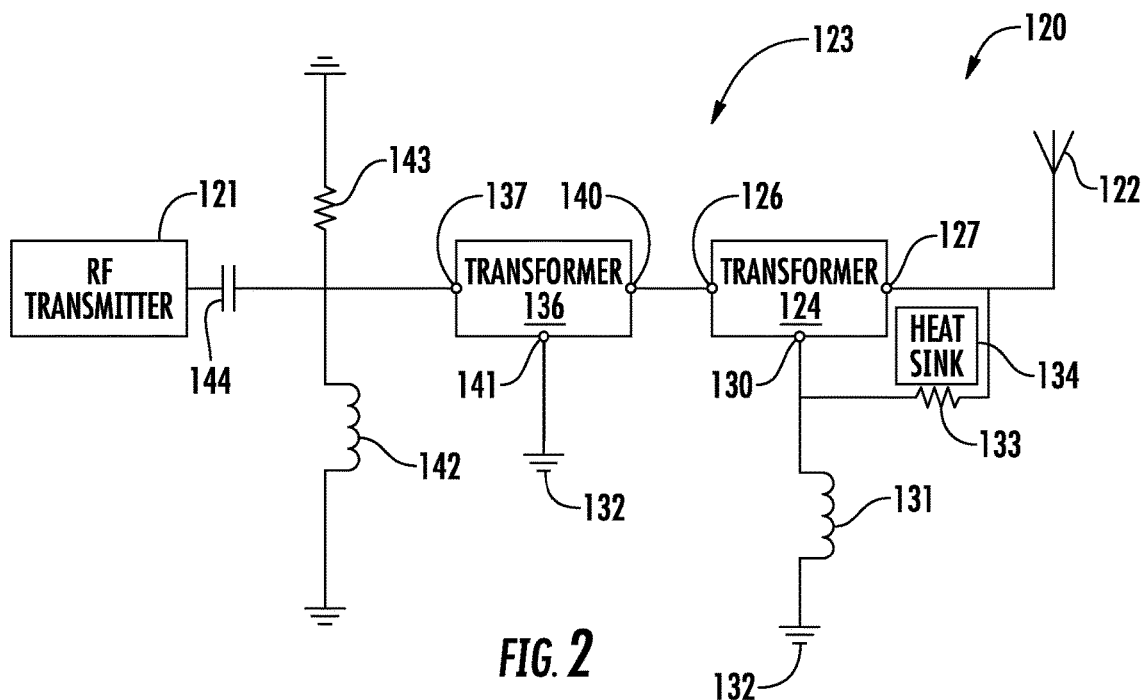
FIG. 2 is a schematic diagram of another example embodiment of the wireless communications device, according to the present disclosure.

Referring now additionally to FIG. 2, another embodiment of the wireless communications device 120 is now described. In this embodiment of the wireless communications device 120, those elements already discussed above with respect to FIG. 1 are incremented by 100 and most require no further discussion herein. This embodiment differs from the previous embodiment in that this wireless communications device 120 illustratively includes the RF matching network 123 having a second RF matching transformer 136 coupled between the RF transmitter 121 and the first RF matching transformer 124 and comprising a second ferrite core and a second plurality of windings coupled thereto. The second RF matching transformer 136 is constituted similarly to the first RF matching transformer shown in FIGS. 4A-4B.

The second RF matching transformer 136 defines a second input terminal 137 coupled to the RF transmitter 121, a second output terminal 140 coupled to the first input terminal 126 of the first RF matching transformer 124, and a second reference terminal 141 coupled to the reference voltage 132. The RF matching network 123 illustratively includes a second inductor 142 coupled between the second input terminal 137 and the reference voltage 132, and a second resistor 143 coupled between the second input terminal and the reference voltage 132. The RF matching network 123 illustratively includes a capacitor 144 coupled between the RF transmitter 121 and the second input terminal 137 of the second matching transformer.

Figure 3:
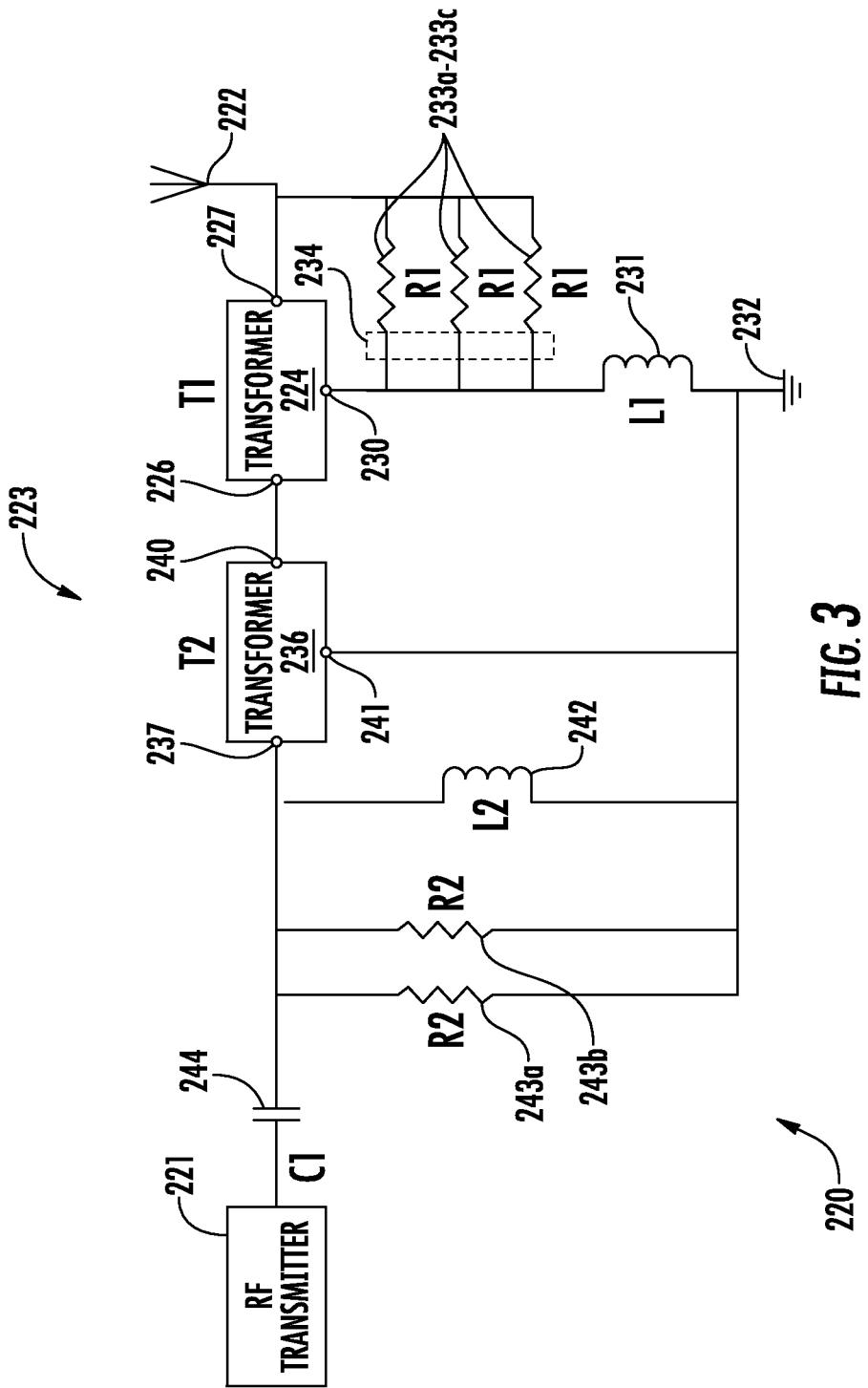
FIG. 3 is a schematic diagram of yet another example embodiment of the wireless communications device, according to the present disclosure.
Figure 5:
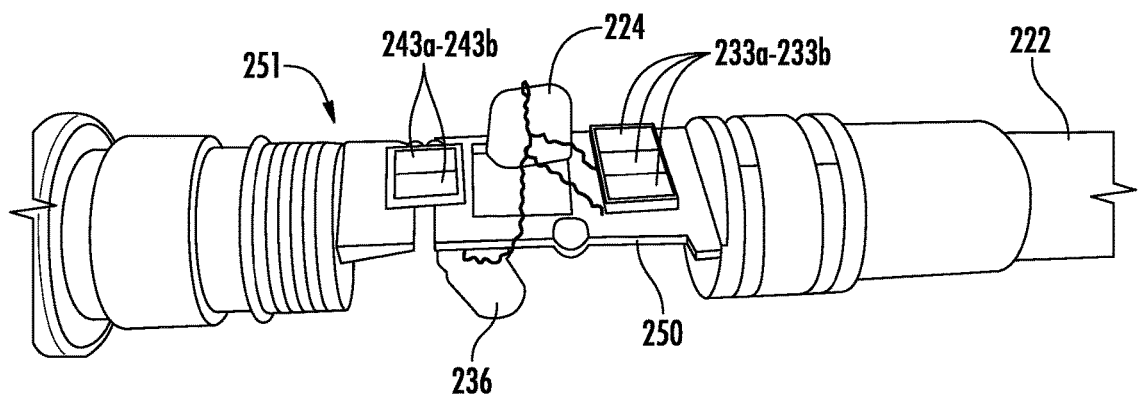
FIG. 5 is a perspective image of components from the wireless communications device of FIG. 3.
Figure 6:
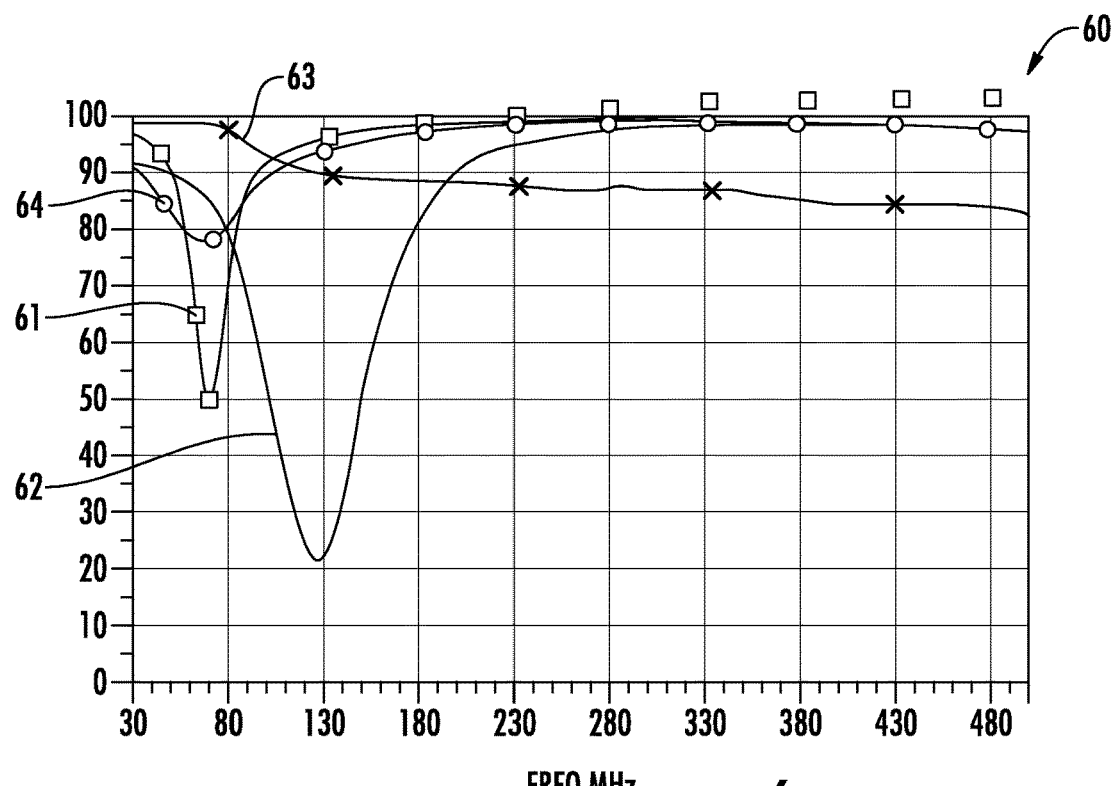
FIGS. 6-15 are diagrams of simulations and measurements for example embodiments of the wireless communications device, according to the present disclosure.
Figure 7:
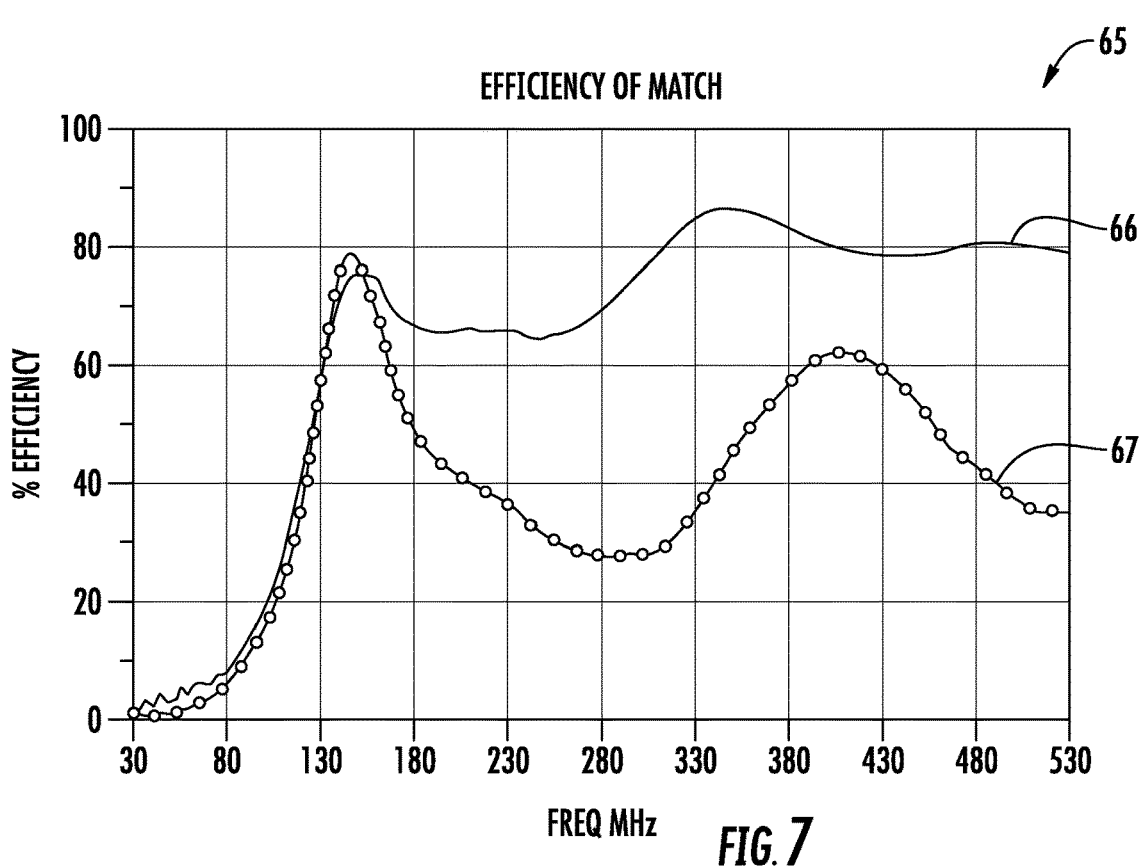
Figure 8:
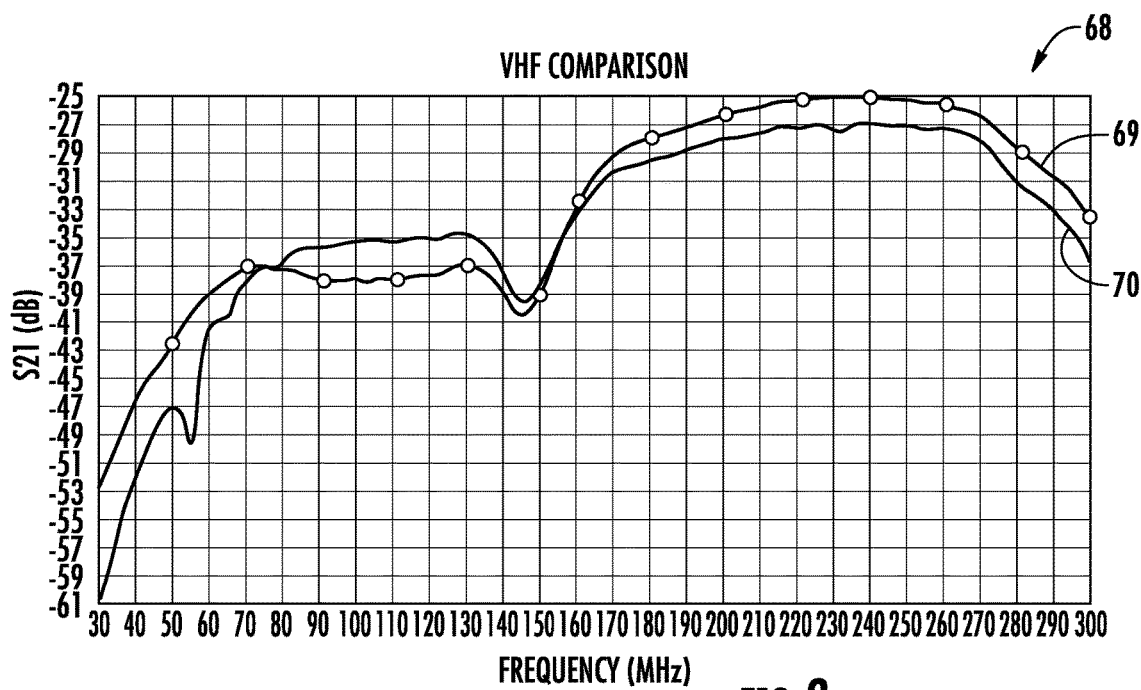
Figure 9:
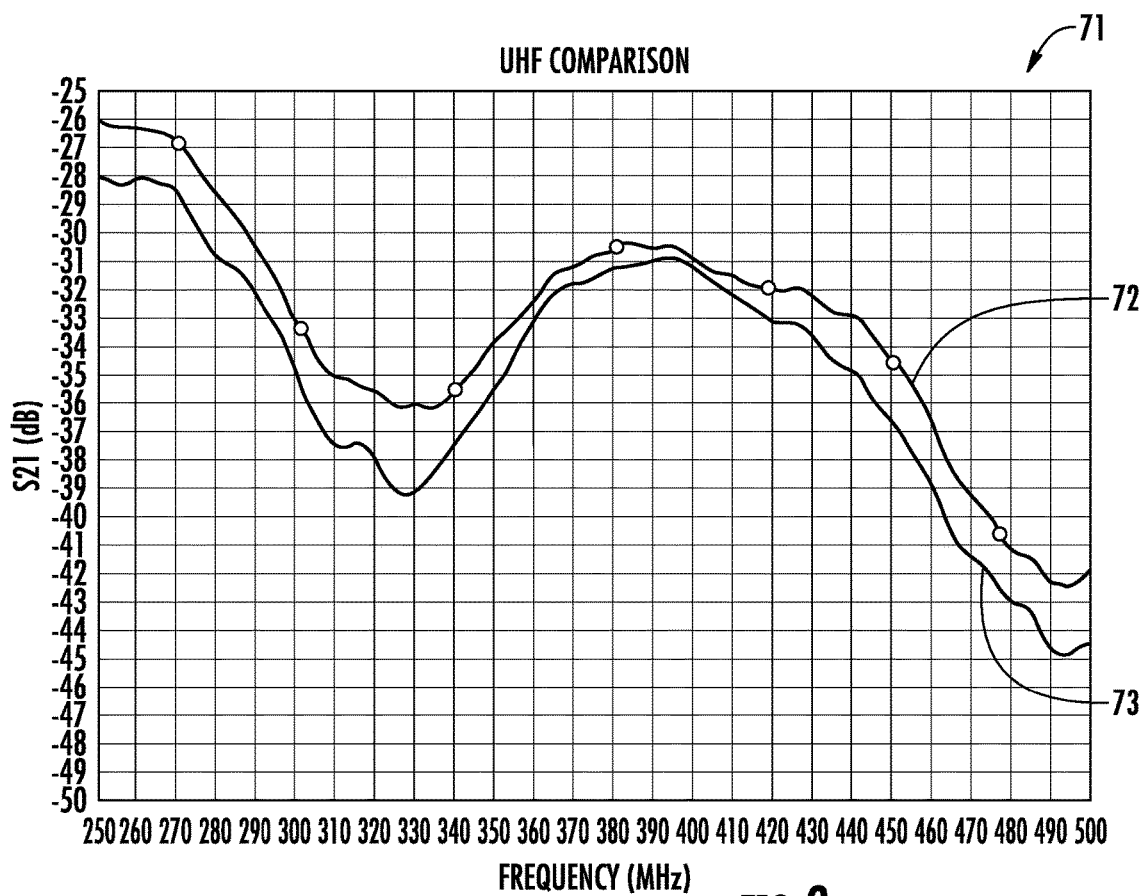
Figure 10:
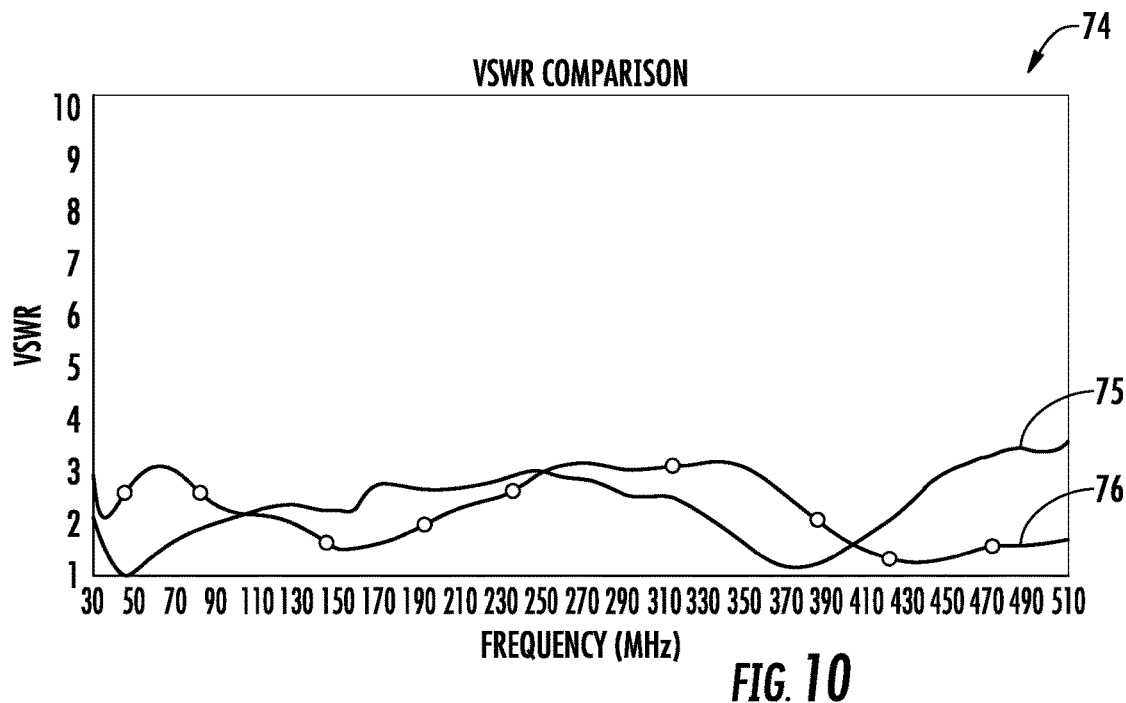
Figure 11:
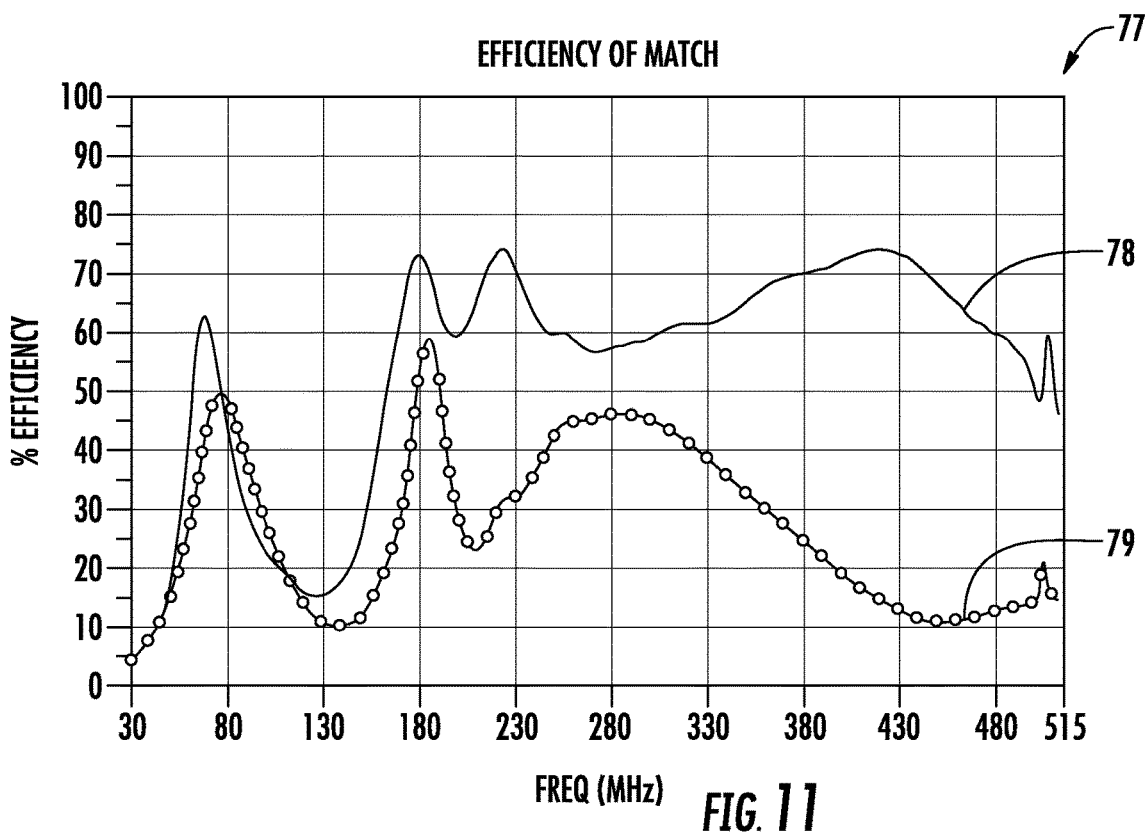
Figure 12:
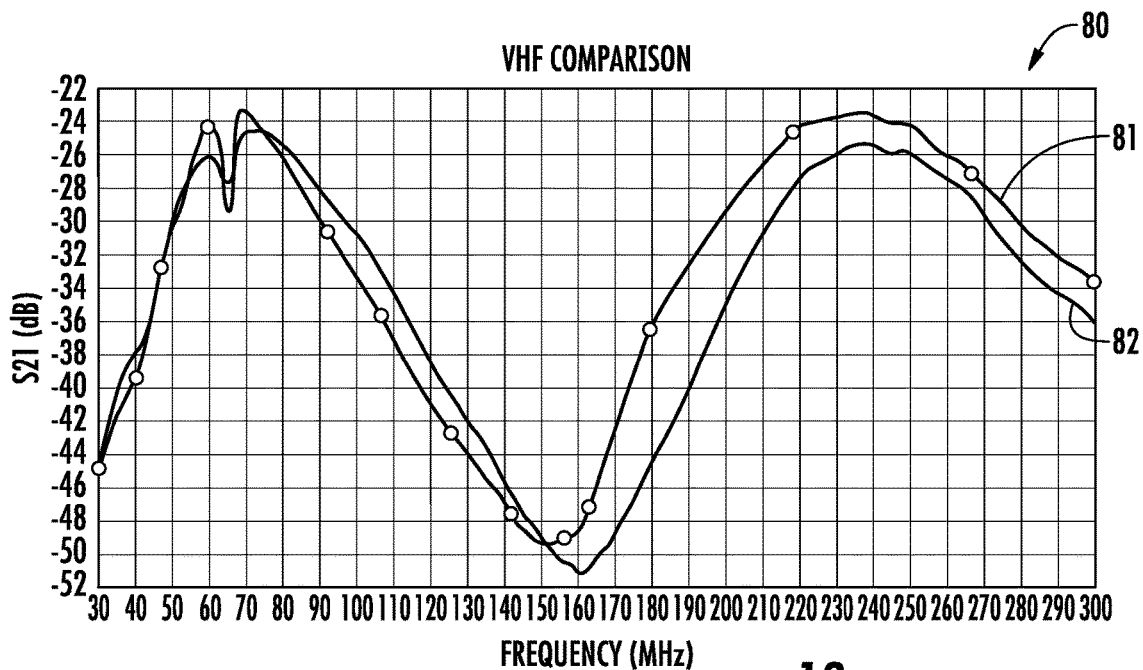
Figure 13:
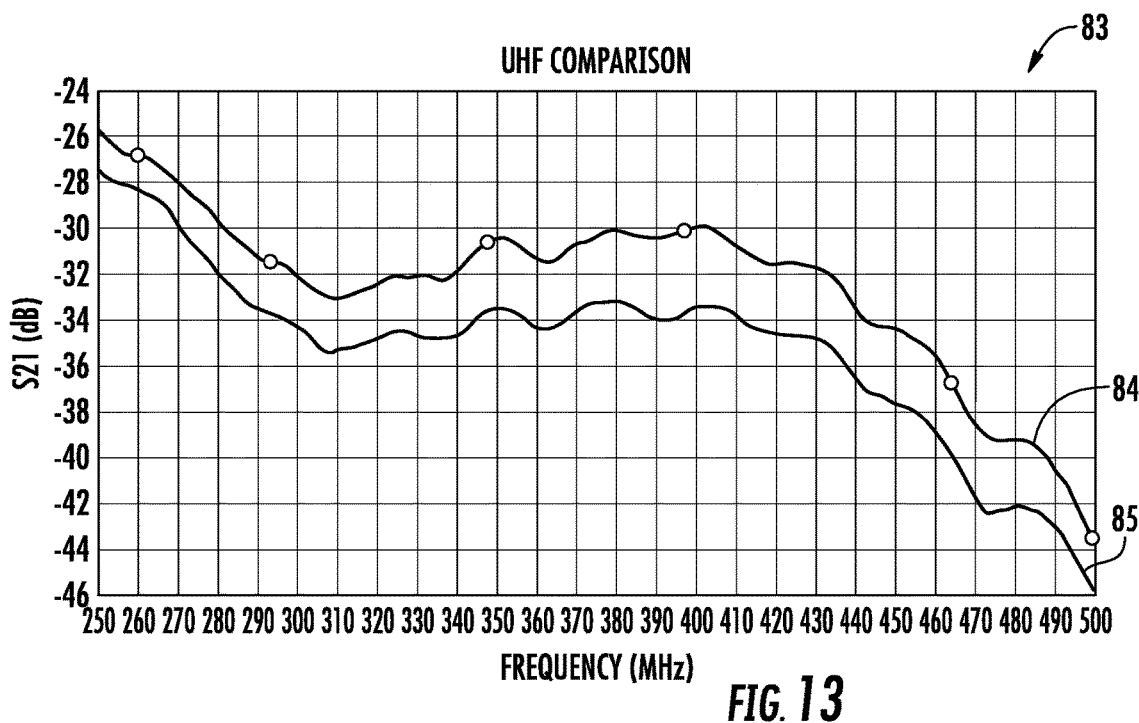
Figure 14:
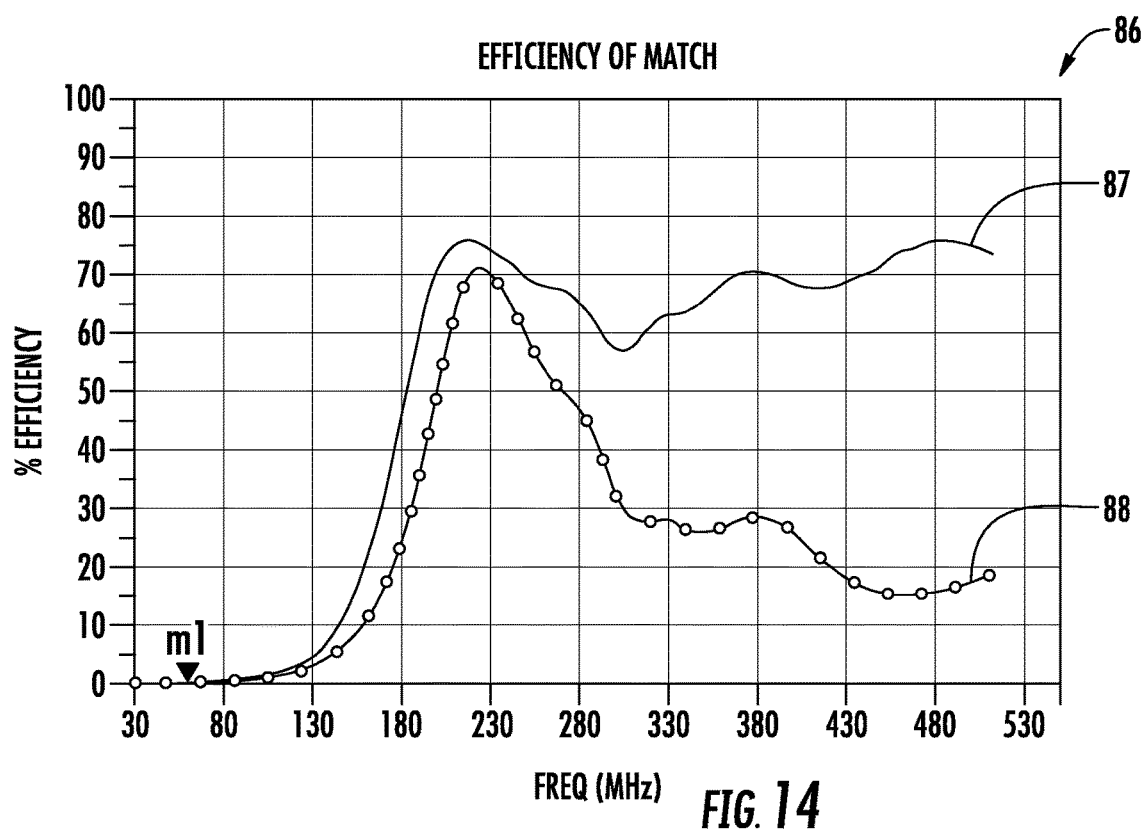
Figure 15:
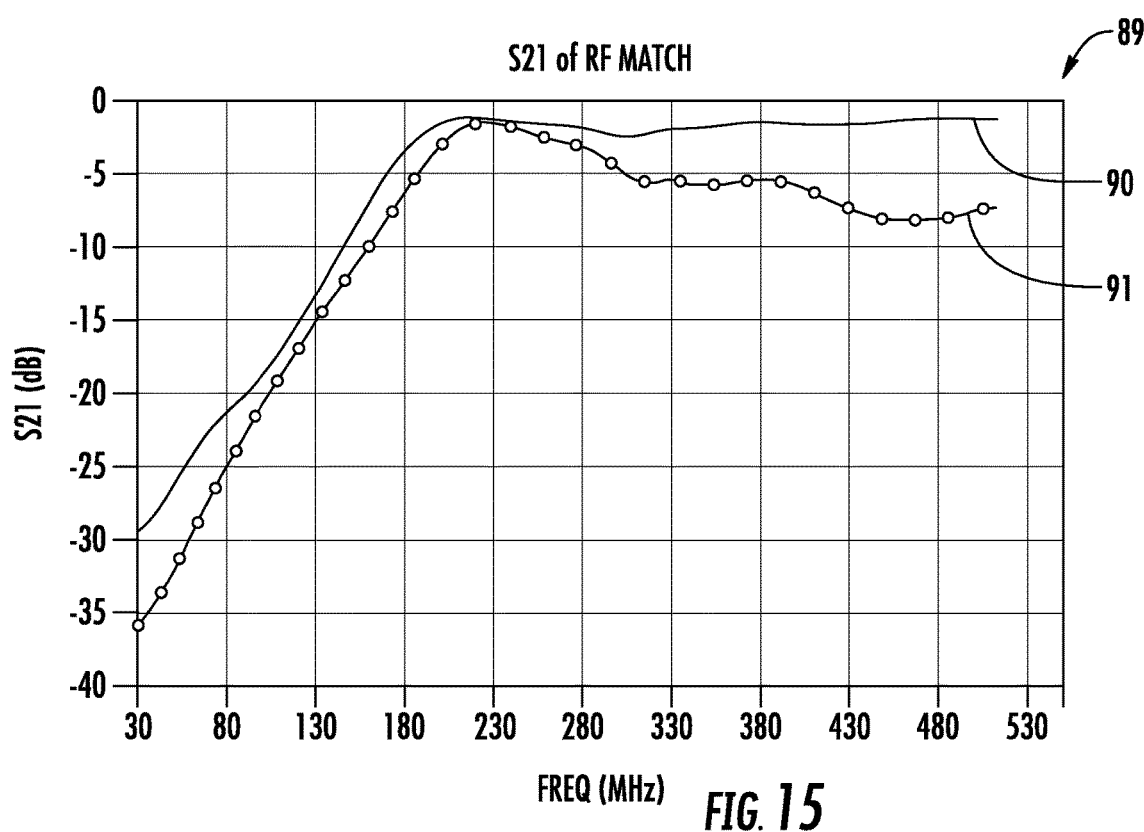

Referring now additionally to FIGS. 3 and 5, another embodiment of the wireless communications device 220 is now described. In this embodiment of the wireless communications device 220, those elements already discussed above with respect to FIG. 1 are incremented by 200 and most require no further discussion herein. This embodiment differs from the previous embodiment in that this wireless communications device 220 illustratively includes the RF matching network 223 having a second RF matching transformer 236 coupled between the RF transmitter 221 and the first RF matching transformer 224 and comprising a second ferrite core and a second plurality of windings coupled thereto. The second RF matching transformer 236 is constituted similarly to the first RF matching transformer shown in FIGS. 4A-4B.

The second RF matching transformer 236 defines a second input terminal 237 coupled to the RF transmitter 221, a second output terminal 240 coupled to the first input terminal 226 of the first RF matching transformer 224, and a second reference terminal 241 coupled to the reference voltage 232. The RF matching network 223 illustratively includes a second inductor 242 coupled between the second input terminal 237 and the second reference terminal 241 of the second RF matching transformer 236. The RF matching network 223 illustratively includes a plurality of second resistors 243a-243b coupled between the second input terminal 237 and the second reference terminal 241 of the second RF matching transformer 236. Also, the RF matching network 223 illustratively includes a plurality of first resistors 233a-233c coupled in parallel between the RF antenna 222 and the first reference terminal 230.

Also, the heat sink 234 comprises a metal body (e.g. aluminum, copper) thermally coupled (e.g. using thermally conductive adhesive) to the plurality of first resistors 233a-233c and the plurality of second resistors 243a-243b. As perhaps best seen in FIG. 5, the metal body comprises at least a portion of an RF connector 251 coupled to the RE antenna and a circuit board 250 carrying the RF matching network 223. Helpfully, this permits the RF matching network 223 to be packaged in a small space, permitting optimum portability. Indeed, in the embodiment of FIG. 5, there is very little space increase for the RE matching network 223.

Referring now to FIGS. 6-15, several simulations of example embodiments of the RF matching device 23, 123, 223 are now described. In diagram 60, the transmitted signal efficiency for several devices are shown. Curve 61 shows efficiency for a RF matching device 23 where the first resistor 33 has a resistance value of 1 kΩ, and the first inductor 31 has an inductance value of 4 µH. Curve 62 shows efficiency for a RF matching device 23 where the first resistor 33 has a resistance value of 4 kΩ, and the first inductor 31 has an inductance value of 500 nH. Curve 64 shows efficiency for a RF matching device 23 where the first resistor 33 has a resistance value of 4 kΩ, and the first inductor 31 has an inductance value of 4 µH. Curve 63 shows efficiency for a wireless communications device where the first resistor, and the first inductor 31 are not present, i.e. just the first RF matching transformer, as in typical approaches, specifically for VHF and UHF frequency range. As evident from diagram 60, the RF matching device 23, 123, & 223 can steer the match as needed, providing the loss notch in only the lower frequency band and providing improved efficiency elsewhere. Of course, these resistance and inductance values are merely examples of potential RF matching performance, and other values could be used.

In diagram 65, 68, 71, & 74, the performance characteristics of the RF matching device 123 of FIG. 2 are shown. In these simulations and measurements, the monopole antenna 122 has an electrical length of 20 inches. Curves 66, 67 respectively show the respective efficiency of the RF matching device 123 (20 inch antenna) and the typical RF transformer matching device. Curves 69, 70 respectively show the respective relative link performance of the RF matching device 123 (20 inch antenna) and the typical device in the VHF band. Curves 72, 73 respectively show the respective relative link performance of the RF matching device 123 (20 inch antenna) and the typical device in the UHF band. Relative link performance is compared within a control anechoic chamber. Curves 76, 75 respectively show the respective voltage standing wave ratio (VSWR) of the RF matching device 123 and antenna 122 and the typical device. Here, VSWR is measured at a low signal power.

In diagram 77, 80, & 83, the performance characteristics of the RF matching device 123 of FIG. 2 are shown. In these simulations and measurements, the antenna 122 has an electrical length of 45 inches. Curves 78, 79 respectively show the respective efficiency of the RF matching device 123 (45 inch antenna) and the typical RF transformer matching device. Curves 81, 82 respectively show the relative link performance of the RF matching device 123 (45 inch antenna) and the typical RF transformer matching device in the VHF band. Curves 84, 85 respectively show the relative link performance of the RF matching device 123 (45 inch antenna) and the typical RF transformer matching device in the UHF band.

In diagram 86 & 89, the performance characteristics of the RF matching device 123 of FIG. 2 are shown. In these simulations, the antenna 122 has an electrical length of 13 inches. Curves 87, 88 respectively show the respective efficiency of the RF matching device 123 (13 inch antenna) and the typical RF transformer matching device. Curves 90, 91 respectively show the relative link performance of the RF matching device 123 (13 inch antenna) and the typical RF transformer matching device in the VHF and UHF bands.

The disclosed RF matching device 23, 123, & 223 provides an advantageous approach to impedance matching between upstream transmission chain and electrically short antennas (e.g. electrical length <10% of longest operating wavelength). This design issue is even more pronounced in broadband applications with a monopole antenna. Current typical RF transformer matching devices have poor efficiency across the band, waste power via thermal radiation, and have high localized heating in the RF matching transformer.

In some typical approaches, active matching is implemented, but these devices require control, feedback, and accurate impedance measurements, drive costs upward, have slow band scanning, and have large physical dimensions. In some typical approaches, active element tuning (i.e. antenna length adjustment) is implemented, but these devices require adjustment of element length for optimum size, drive costs upward, have slow band scanning, and are mechanically complicated.

The disclosed RF matching device 23, 123, & 223 may provide improved efficiency, i.e. more radiated RF power rather than wasted radiated thermal energy. Because of this enhanced efficiency, the RF matching device 23, 123, & 223 may provide greater transmit range, lower power consumption, improved battery life, and a decrease in overall temperature of the device.

Also, the RF matching device 23, 123, & 223 may provide an approach to reducing hotspots and other thermal issues by distributing the thermal radiating sources, permitting more effective heatsink application. The RF matching device 23, 123, & 223 may also be used more safely for continuous operations or higher power operations, as compared to typical devices with hotspots.

Moreover, the RF matching device 23, 123, & 223 has self-variable matching (albeit frequency dependent), providing less matching at the higher frequencies and more matching at lower frequencies. In particular, the RF matching device 23, 123, & 223 concentrates the loss at the lower frequencies. Lastly, the RF matching device 23, 123, & 223 provides for a minor complexity cost increase while maintains full contiguous bandwidth to allow full band scanning.

Lastly, electric short antennas typical include RE transformers to transform the impedance, for example, including 2 fold, 4 fold, or more. RF transformers are lossy as a function of the chosen core and windings, and generate heat due to the loss. Indeed, once they hit the Curie temperature, they lose their transformation characteristics. The RF matching device 23, 123, & 223 may allow the use of transformers while preventing Curie temperature to be hit. Also, the RF matching device 23, 123, & 223 may control the loss better to maximize efficiency over the band, move the heat loss away from the transformer, and move the heat to near a heat sink.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A wireless communications device comprising:
   a radio frequency (RF) transmitter having an operating frequency range;
   an RF antenna having an electrical length less than or equal to one-tenth of a wavelength of a lowest operating frequency of the operating frequency range; and
   an RF matching network coupled between said RF transmitter and said RE antenna, said RF matching network comprising
      a first RF matching transformer comprising a first ferrite core and a first plurality of windings coupled thereto, said first RF matching transformer defining a first input terminal, a first output terminal, and a first reference terminal,
      a first inductor coupled between the first reference terminal and a reference voltage, and
      at least one first resistor coupled across the first output terminal and the first reference terminal and configured to dissipate heat that would otherwise be dissipated by said first RF matching transformer to reduce an operating temperature of said first RF matching transformer.

2. The wireless communications device of claim 1 wherein said at least one first resistor comprises a plurality of first resistors coupled in parallel.

3. The wireless communications device of claim 1 further comprising a heat sink coupled to said at least one first resistor.

4. The wireless communications device of claim 3 wherein said heat sink is thermally coupled to said RF antenna.

5. The wireless communications device of claim 1 wherein said first ferrite core comprises a ferrite body having a pair of spaced apart, winding-receiving passageways therein.

6. The wireless communications device of claim 1 wherein said RF matching network comprises a second RF matching transformer coupled between said RF transmitter and said first RF matching transformer and comprising a second ferrite core and a second plurality of windings coupled thereto; and wherein said second RF matching transformer defines a second input terminal coupled to said RF transmitter, a second output terminal coupled to the first input terminal of the first RF matching transformer, and a second reference terminal coupled to the reference voltage.

7. The wireless communications device of claim 6 wherein the RF matching network comprises a second inductor coupled between the second input terminal and the second reference terminal of said second RF matching transformer, and at least one second resistor coupled between the second input terminal and the second reference terminal of said second RF matching transformer.

8. A wireless communications device comprising:
a radio frequency (RE) transmitter having an operating frequency range;
an RF antenna having an electrical length less than or equal to one-tenth of a wavelength of a lowest operating frequency of the operating frequency range; and
an RF matching network coupled between said RF transmitter and said RF antenna, said RF matching network comprising
a first RF matching transformer comprising a first ferrite core and a first plurality of windings coupled thereto, said first RF matching transformer defining a first input terminal, a first output terminal, and a first reference terminal,
a first inductor coupled between the first reference terminal and a reference voltage,
a plurality of first resistors coupled in parallel across the first output terminal and the first reference terminal and configured to dissipate heat that would otherwise be dissipated by said first RF matching transformer to reduce an operating temperature of said first RF matching transformer,
a heat sink coupled to said plurality of first resistors, and
a second RE matching transformer coupled between said RE transmitter and said first RF matching transformer and comprising a second ferrite core and a second plurality of windings coupled thereto;
said second RF matching transformer defining a second input terminal coupled to said RF transmitter, a second output terminal coupled to the first input terminal of the first RF matching transformer, and a second reference terminal coupled to the reference voltage.

9. The wireless communications device of claim 8 wherein said heat sink comprises a metal body.

10. The wireless communications device of claim 9 wherein said metal body comprises at least a portion of an RF connector coupled to said RF antenna.

11. The wireless communications device of claim 8 wherein said first ferrite core comprises a ferrite body having a pair of spaced apart, winding-receiving passageways therein.

12. The wireless communications device of claim 8 wherein the RF matching network comprises a second inductor coupled between the second input terminal and the second reference terminal of said second RF matching transformer, and at least one second resistor coupled between the second input terminal and the second reference terminal of said second RF matching transformer.

13. The wireless communications device of claim 8 further comprising a portable housing carrying said RF transmitter, RF antenna, and RF matching network.

14. A radio frequency (RF) matching network to be coupled between a RF transmitter and a RF antenna, the RF antenna having an electrical length less than or equal to one-tenth of a wavelength of a lowest operating frequency of an operating frequency range of the RF transmitter, the RF matching network comprising:
a first RF matching transformer comprising a first ferrite core and a first plurality of windings coupled thereto, said first RF matching transformer defining a first input terminal, a first output terminal, and a first reference terminal;
a first inductor coupled between the first reference terminal and a reference voltage;
at least one first resistor coupled across the first output terminal and the first reference terminal and configured to dissipate heat that would otherwise be dissipated by said first RF matching transformer to reduce an operating temperature of said first RF matching transformer; and
a heat sink coupled to said at least one first resistor and comprising at least a portion of an RF connector coupled to the RF antenna.

15. The RF matching network of claim 14 wherein said at least one first resistor comprises a plurality of first resistors coupled in parallel.

16. The RF matching network of claim 14 wherein said first ferrite core comprises a ferrite body having a pair of spaced apart, winding-receiving passageways therein.

17. The RF matching network of claim 14 further comprising a second RF matching transformer coupled between the RF transmitter and said first RF matching transformer and comprising a second ferrite core and a second plurality of windings coupled thereto; and wherein said second RF matching transformer defines a second input terminal coupled to the RF transmitter, a second output terminal coupled to the first input terminal of the first RF matching transformer, and a second reference terminal coupled to the reference voltage.

18. A method of making a wireless communications device, the method comprising:
providing a radio frequency (RF) transmitter having an operating frequency range, and an RF antenna having an electrical length less than or equal to one-tenth of a wavelength of a lowest operating frequency of the operating frequency range; and
coupling an RF matching network between the RF transmitter and the RF antenna, the RF matching network comprising
a first RF matching transformer comprising a first ferrite core and a first plurality of windings coupled thereto, the first RF matching transformer defining a first input terminal, a first output terminal, and a first reference terminal,
a first inductor coupled between the first reference terminal and a reference voltage, and
at least one first resistor coupled across the first output terminal and the first reference terminal and configured to dissipate heat that would otherwise be dissipated by the first RF matching transformer to reduce an operating temperature of the first RF matching transformer.

19. The method of claim 18 wherein the at least one first resistor comprises a plurality of first resistors coupled in parallel.

20. The method of claim 18 further comprising coupling a heat sink to the at least one first resistor.

* * * * *